US009869742B2

(12) United States Patent
Kamata et al.

(10) Patent No.: US 9,869,742 B2
(45) Date of Patent: Jan. 16, 2018

(54) MAGNETIC RESONANCE IMAGING APPARATUS AND FREQUENCY SHIFT MEASURING METHOD

(71) Applicant: TOSHIBA MEDICAL SYSTEMS CORPORATION, Otawara-Shi, Tochigi-Ken (JP)

(72) Inventors: Mitsukazu Kamata, Nasushiobara Tochigi (JP); Masaaki Umeda, Sakura Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 834 days.

(21) Appl. No.: 14/453,004

(22) Filed: Aug. 6, 2014

(65) Prior Publication Data

US 2014/0347052 A1 Nov. 27, 2014

Related U.S. Application Data

(63) Continuation of application No. PCT/JP2013/078730, filed on Oct. 23, 2013.

(30) Foreign Application Priority Data

Oct. 26, 2012 (JP) ................................. 2012-237062

(51) Int. Cl.
*G01V 3/00* (2006.01)
*G01R 33/565* (2006.01)
*G01R 33/58* (2006.01)

(52) U.S. Cl.
CPC ... *G01R 33/5659* (2013.01); *G01R 33/56518* (2013.01); *G01R 33/56563* (2013.01); *G01R 33/583* (2013.01); *G01R 33/56572* (2013.01)

(58) Field of Classification Search
CPC .................................................. G01R 33/583
(Continued)

(56) References Cited

U.S. PATENT DOCUMENTS 5,923,168 A 7/1999 Zhou et al.
6,512,372 B1 1/2003 Ikezaki
(Continued)

FOREIGN PATENT DOCUMENTS

JP 11-76201 3/1999
JP 2001-37738 2/2001
JP 2001-87244 4/2001

OTHER PUBLICATIONS

English Translation of International Preliminary Report on Patentability issued Apr. 28, 2015 for Application No. PCT/JP2013/078730.
(Continued)

*Primary Examiner* — Louis Arana
(74) *Attorney, Agent, or Firm* — Nixon & Vanderhye P.C.

(57) ABSTRACT

According to one embodiment, a magnetic resonance imaging apparatus includes a phase image generating unit, an image value acquisition unit and a frequency shift calculation unit. The phase image generating unit executes a sequence including an application of a bipolar gradient pulse and thereby generates a first phase image. The image value acquisition unit acquires an image value of the first phase image. The frequency shift calculation unit determines an amount of frequency shift per unit amount of gradient magnetic field based on magnetic field strength of the bipolar gradient pulse and on the image value of the first phase image.

9 Claims, 8 Drawing Sheets

(58) Field of Classification Search
USPC .................................................. 324/318, 322
See application file for complete search history.

(56) References Cited

U.S. PATENT DOCUMENTS

| | | | |
|---|---|---|---|
| 6,515,478 B1 | 2/2003 | Wicklow et al. | |
| 8,952,692 B2* | 2/2015 | Takahashi | G01R 33/483 324/307 |
| 2006/0022674 A1 | 2/2006 | Zhou et al. | |
| 2014/0300357 A1* | 10/2014 | Bachschmidt | G01R 33/5659 324/309 |
| 2015/0160321 A1* | 6/2015 | Patil | G01R 33/56563 324/309 |
| 2015/0346309 A1* | 12/2015 | Campagna | G01R 33/543 324/307 |

OTHER PUBLICATIONS

International Search Report for PCT/JP2013/078730 dated Nov. 26, 2013.

* cited by examiner

MAGNETIC RESONANCE IMAGING APPARATUS AND FREQUENCY SHIFT MEASURING METHOD

CROSS-REFERENCE TO RELATED APPLICATIONS

This application is a Continuation application of No. PCT/JP2013/78730, filed on Oct. 23, 2013, and the PCT application is based upon and claims the benefit of priority from Japanese Patent Application No. 2012-237062, filed on Oct. 26, 2012, the entire contents of which are incorporated herein by reference.

FIELD

Embodiments described herein relate generally to a magnetic resonance imaging apparatus and a frequency shift measuring method.

BACKGROUND

A magnetic resonance imaging (MRI) apparatus magnetically excites nuclear spins of an object placed in a static magnetic field with an RF signal at Larmor frequency to reconstruct an image using a magnetic resonance signal resulting from the excitation.

For this type of MRI apparatus, it is important to reduce various impacts such as eddy currents which reduce image quality of images.

Static magnetic field strength of the MRI apparatus might fluctuate due to various factors such as execution of a pulse sequence or variation with time. On the other hand, the static magnetic field strength is proportionally related to resonant frequency. Consequently, if the static magnetic field strength fluctuates, when any gradient magnetic field is applied, a frequency shift corresponding to an amount of the gradient magnetic field might occur, causing fluctuations of center frequency. An amount of fluctuation varies with a state of adjustment of the gradient coil and a phase of atomic nuclei excited during imaging is modulated by this phenomenon, resulting in losses of image quality in the form of a reduced SNR and sensitivity irregularities. Therefore, if frequency shifts occur, preferably amounts of the frequency shifts are measured quantitatively to reduce impacts of the frequency shifts on the image quality.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Hereinbelow, a description will be given of a magnetic resonance imaging apparatus and a frequency shift measuring method according to embodiments of the present invention with reference to the drawings.

In general, according to one embodiment, a magnetic resonance imaging apparatus includes a phase image generating unit, an image value acquisition unit and a frequency shift calculation unit. The phase image generating unit executes a sequence including an application of a bipolar gradient pulse and thereby generates a first phase image. The image value acquisition unit acquires an image value of the first phase image. The frequency shift calculation unit determines an amount of frequency shift per unit amount of gradient magnetic field based on magnetic field strength of the bipolar gradient pulse and on the image value of the first phase image.

Figure 1:
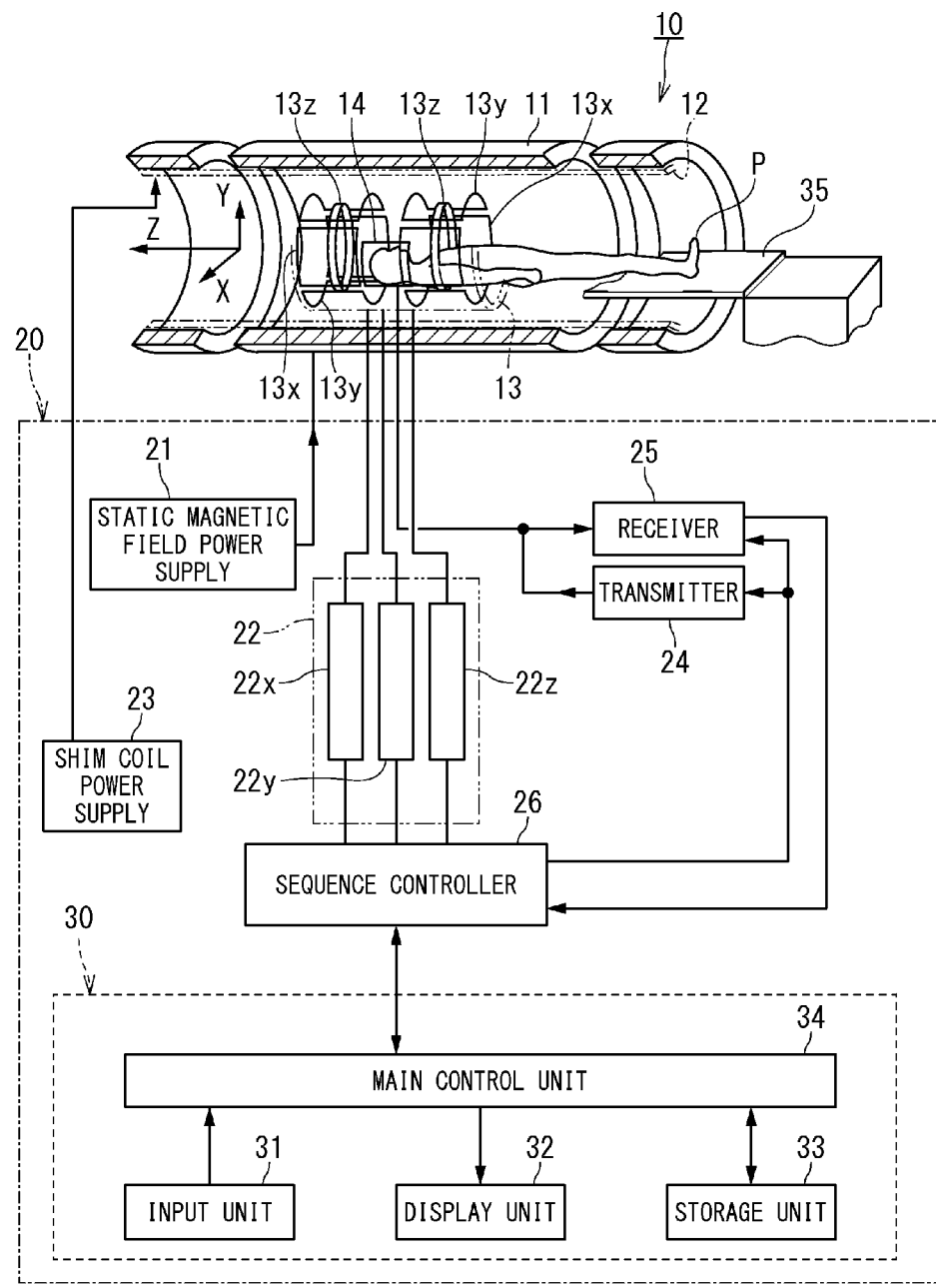
FIG. 1 is a block diagram showing a configuration example of an MRI apparatus according to a first embodiment of the present invention.

FIG. 1 is a block diagram showing a configuration example of an MRI apparatus 10 according to a first embodiment of the present invention.

The MRI apparatus 10 includes a static magnetic field magnet 11 configured to be cylindrical in shape and adapted to generate a static magnetic field, a shim coil 12 installed in the static magnetic field magnet 11, a gradient coil unit 13, and an RF coil unit 14. These components are contained in a gantry.

Also, the MRI apparatus 10 includes a control system 20. The control system 20 has a static magnetic field power supply 21, a gradient power supply 22, a shim coil power supply 23, a transmitter 24, a receiver 25, a sequence controller 26, and an information processing apparatus 30.

The gradient power supply 22 of the control system 20 includes an X-axis gradient power supply 22x, Y-axis gradient power supply 22y, and Z-axis gradient power supply 22z.

The information processing apparatus 30 is equipped with an input unit 31, a display unit 32, a storage unit 33, and a main control unit 34.

The static magnetic field magnet 11 is connected with the static magnetic field power supply 21 and forms a static magnetic field in an imaging area using an electric current supplied from the static magnetic field power supply 21. The static magnetic field magnet 11 is made of a superconducting coil and is connected with the static magnetic field power supply 21 at the time of energization to draw electric current, but may be disconnected once energized. Incidentally, there are cases in which the static magnetic field magnet 11 may be made of a permanent magnet without installation of the static magnetic field power supply 21.

The shim coil 12 cylindrical in shape is installed concentrically inside the static magnetic field magnet 11. The shim coil 12 is connected with the shim coil power supply 23 and supplied with electric current from the shim coil power supply 23 so as to make the static magnetic field uniform.

The gradient coil unit 13, which includes an X-axis gradient coil 13x, Y-axis gradient coil 13y, and Z-axis gradient coil 13z, is formed into a cylindrical shape inside the static magnetic field magnet 11. A bed 35 is installed in the gradient coil unit 13 and used as an imaging area with an object P placed thereon. The RF coil unit 14 may be installed near the bed 35 or object P instead of being incorporated in a gantry.

Also, the gradient coil unit 13 is connected with the gradient power supply 22. The X-axis gradient coil 13x, Y-axis gradient coil 13y, and Z-axis gradient coil 13z of the gradient coil unit 13 are connected, respectively, with the X-axis gradient power supply 22x, Y-axis gradient power supply 22y, and Z-axis gradient power supply 22z of the gradient power supply 22.

A gradient magnetic field Gx in an X-axis direction, a gradient magnetic field Gy in a Y-axis direction, and a gradient magnetic field Gz in a Z-axis direction are formed in the imaging area, respectively, by electric currents supplied to the X-axis gradient coil 13x, Y-axis gradient coil 13y, and Z-axis gradient coil 13z from the X-axis gradient power supply 22x, Y-axis gradient power supply 22y, and Z-axis gradient power supply 22z, respectively.

The RF coil unit 14 is connected with the transmitter 24 and the receiver 25. The RF coil unit 14 has a capability to receive a radio-frequency signal from the transmitter 24 and transmit the radio-frequency signal to the object P as well as a capability to receive an MR signal generated when nuclear spins in the object P are excited by the radio-frequency signal and supply the MR signal to the receiver 25.

The sequence controller 26 of the control system 20 is connected with the gradient power supply 22, transmitter 24, and receiver 25. The sequence controller 26 is made up of storage media and the like including a CPU, RAM, and ROM and adapted to store sequence information received from the information processing apparatus 30. The sequence information includes control information needed to drive the gradient power supply 22, transmitter 24, and receiver 25, i.e., for example, operational control information such as intensity, application duration, and application timing of a pulsed current to be applied to the gradient power supply 22.

By controlling operation of the gradient power supply 22, transmitter 24, and receiver 25 based on the sequence information, the sequence controller 26 generates, for example, the X-axis gradient magnetic field Gx, Y-axis gradient magnetic field Gy, and Z-axis gradient magnetic field Gz as well as a radio-frequency signal. Based on the control information received from the sequence controller 26, the transmitter 24 supplies the radio-frequency signal to the RF coil unit 14. Also, digital data (MR signal) outputted from the receiver 25 is supplied to the information processing apparatus 30 via the sequence controller 26.

The main control unit 34 of the information processing apparatus 30 can easily control the sequence controller 26 by adding information to the sequence information as appropriate or by rewriting the sequence information itself. For example, to correct a phase of an RF transmit pulse, the main control unit 34 adds information to that effect to the sequence information or modifies the sequence information so as to include the information to that effect, thereby controlling the transmitter 24 via the sequence controller 26 so as to correct the phase of the RF transmit pulse. Also, to correct a phase of a receive signal, the main control unit 34 adds information to that effect to the sequence information or modifies the sequence information so as to include the information to that effect, thereby controlling the receiver 25 via the sequence controller 26 so as to correct the phase of the receive signal.

The input unit 31 of the information processing apparatus 30, which is made up of a typical input device such as a keyboard, touch panel, numerical keypad, or track ball, outputs a user input signal corresponding to user actions to the main control unit 34. For example, the user provides information such as a measurement start command or sequence start command to the control unit 34 via the input unit 31, where the measurement start command is used to start measuring an amount of frequency shift while the sequence start command is used to start a sequence of acquiring a scan image (MR image).

Under the control of the main control unit 34, the display unit 32, which is a typical display output device such as a liquid crystal display or OLED (Organic Light Emitting Diode) display, displays various kinds of information such as scan images generated by the main control unit 34.

The storage unit 33, which is a non-volatile storage medium readable and writeable by the main control unit 34, stores various kinds of sequence information, raw data of images, various images such as scan images, and the like. Also, the storage unit 33 stores, as required, information about the amount of frequency shift determined by the main control unit 34.

The main control unit 34 is made up of storage media and the like including a CPU, RAM, and ROM and adapted to control the sequence controller 26 according to programs stored in the storage media.

The CPU of the main control unit 34 loads a frequency shift correction program and data necessary for execution of the program into the RAM from storage media including the ROM. Then, according to the program, the CPU performs a process of quantitatively measuring the amount of frequency shift and a process of reducing an impact of the frequency shift on scan images based on the measured amount of frequency shift.

The RAM of the main control unit 34 provides a work area for use to temporarily store the program executed by the CPU as well as data related to the execution.

The storage media of the main control unit 34 including the ROM store a boot program of the information processing apparatus 30, a frequency shift correction program, and various data necessary for execution of these programs.

Note that the storage media including the ROM may be configured to include a recording medium readable by the CPU, such as a magnetic or optical recording medium or a semiconductor memory, and download some or all of programs and data onto these storage media via an electronic network. Also, these storage media store, as required, information about the amount of frequency shift determined by the main control unit 34.

Figure 2:
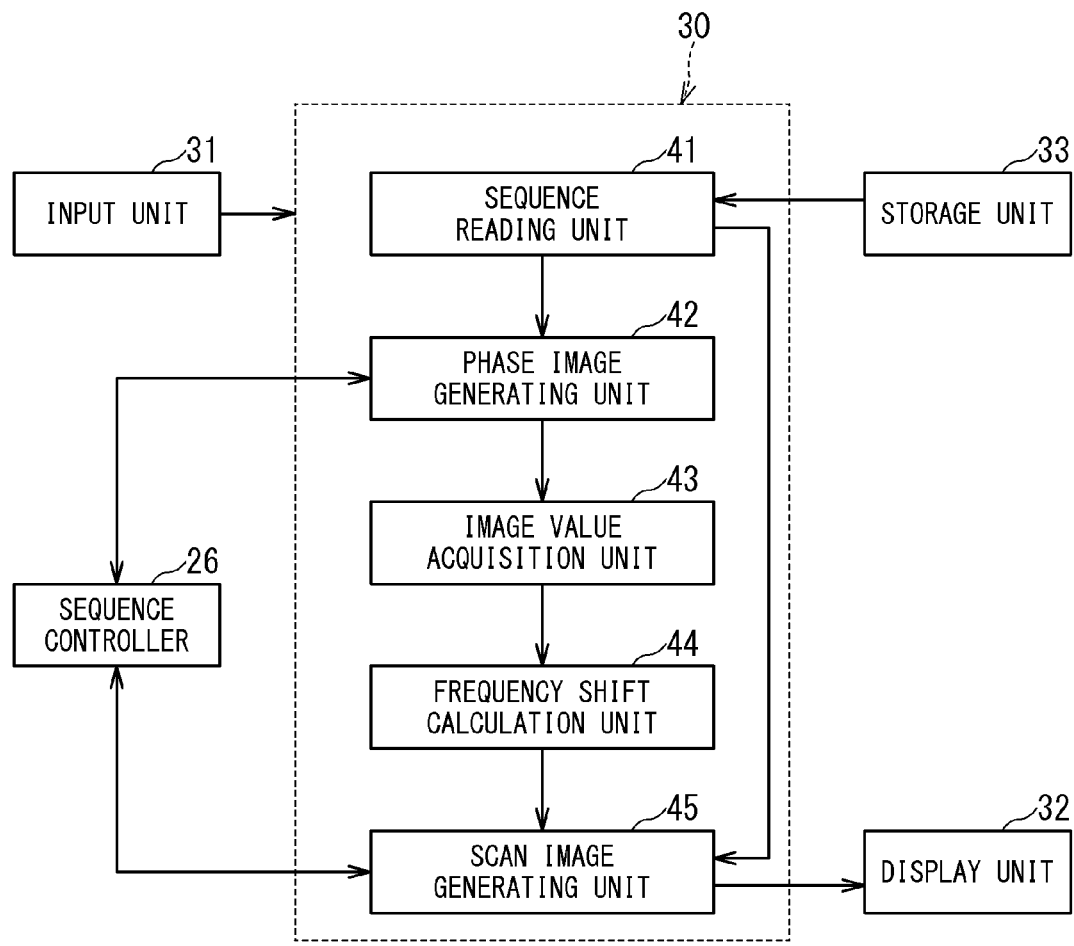
FIG. 2 is a schematic block diagram showing a configuration example of a function implementation portion implemented by the CPU of the main control unit.

FIG. 2 is a schematic block diagram showing a configuration example of a function implementation portion implemented by the CPU of the main control unit 34. Note that the function implementation portion may be implemented by a hardware logic such as a circuit rather than a CPU.

As shown in FIG. 2, based on the frequency shift correction program, the CPU of the main control unit 34 functions at least as a sequence reading unit 41, a phase image generating unit 42, an image value acquisition unit 43, a frequency shift calculation unit 44, and a scan image generating unit 45. These components 41 to 45 use a required work area of the RAM as temporary storage location of data.

The sequence reading unit 41 reads sequence information out of the storage unit 33 and displays an image which represents content of the sequence information on the display unit 32 as required.

Now, a method for quantitatively determining the amount of frequency shift will be described.

Figures 3, 4:
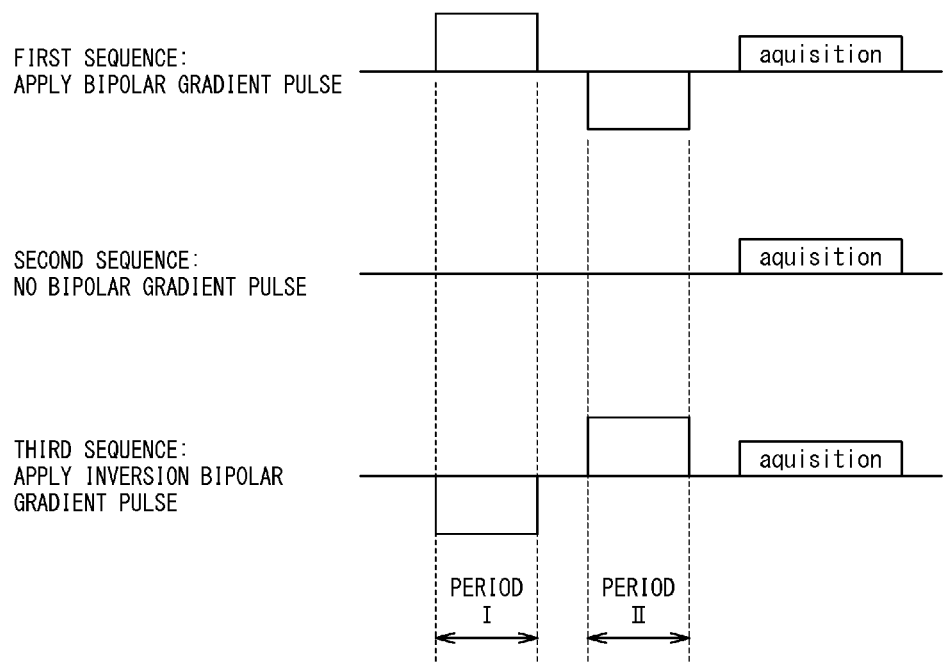
FIG. 3 is an explanatory diagram showing an example of a sequence executed to quantitatively measure the amount of frequency shift.
FIG. 4 is an explanatory diagram showing an example of a relationship of the periods I and II of the first, second, and third sequences shown in FIG. 3 with signal polarities of frequency shift, eddy current, and environmental noise.

FIG. 3 is an explanatory diagram showing an example of a sequence executed to quantitatively measure the amount of frequency shift.

Depending on a state of adjustment of the gradient coil unit 13, static magnetic field strength might fluctuate, causing the frequency of the entire space to shift when a gradient magnetic field is applied.

Any frequency shift will result in degradation of image quality of MR images obtained when a scan sequence is executed by FSE (Fast Spin Echo) method, EPI (Echo Planar Imaging) method, phase contrast (PC) method or the like.

Thus, the MRI apparatus 10 according to the present embodiment quantitatively determines the amount of frequency shift based on an image value of the image obtained by executing the sequences shown in FIG. 3 and reduces the impact of the frequency shift on the MR image based on the amount of frequency shift which has been determined.

A first sequence involves applying a bipolar gradient pulse. A second sequence does not involve a gradient pulse. A third sequence involves applying a pulse obtained by inverting a polarity of the bipolar gradient pulse applied in the first sequence (hereinafter referred to as an inversion bipolar gradient pulse).

Although FIG. 3 shows an example in which a positive pulse is applied during a period I of the first sequence and a negative pulse is applied during a period II, a negative pulse may be applied during the period I and a positive pulse may be applied during the period II. In either case, a third sequence involves applying an inversion bipolar gradient pulse of the bipolar gradient pulse applied in the first sequence.

FIG. 4 is an explanatory diagram showing an example of a relationship of the periods I and II of the first, second, and third sequences shown in FIG. 3 with signal polarities of frequency shift, eddy current, and environmental noise.

A polarity of the frequency shift amount does not depend on a polarity of the gradient magnetic field, and so in the first sequence and third sequence in which the gradient magnetic field is applied, the amount of frequency shift maintains a same polarity (during both periods I and II) regardless of the polarity of the gradient magnetic field. In the second sequence in which no gradient magnetic field is applied, the amount of frequency shift is zero.

On the other hand, the eddy current changes its polarity according to the polarity of the gradient magnetic field, and thus in the first sequence and third sequence in which the gradient magnetic field is applied, the eddy current coincides in polarity with the gradient magnetic field. In the second sequence in which no gradient magnetic field is applied, the eddy current is zero.

As environmental noise caused by non-uniformity of the static magnetic field or non-uniformity of RF and regarded to be extraneous from the perspective of the present embodiment, a nonpolarized signal of a certain magnitude is mixed in the receive data during all the periods of all the sequences. In FIG. 4, presence of environmental noise is indicated by a circle symbol.

Possible methods for quantitatively determining the amount of frequency shift (hereinafter referred to as frequency shift measuring method) include, for example, the following four methods.

A first frequency shift measuring method determines the amount of frequency shift using only the first sequence.

Figure 5:
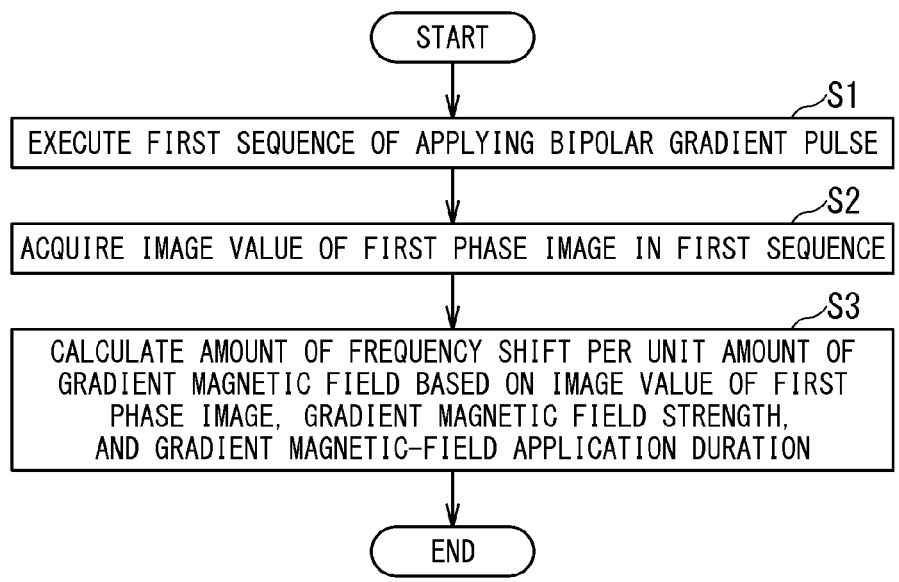
FIG. 5 is a flowchart showing an example of procedures carried out by the CPU of the main control unit shown in FIG. 1 to measure the amount of frequency shift using the first frequency shift measuring method.

FIG. 5 is a flowchart showing an example of procedures carried out by the CPU of the main control unit 34 shown in FIG. 1 to measure the amount of frequency shift using the first frequency shift measuring method. In FIG. 5, numbers prefixed by S represent steps of the flowchart. The procedures are started when sequence information about the first sequence is read out of the storage unit 33 by the sequence reading unit 41.

First, in step S1, the phase image generating unit 42 executes the loaded first sequence and generates a phase image (hereinafter referred to as a first phase image) based on data obtained in the first sequence.

Next, in step S2, the image value acquisition unit 43 acquires an image value of the first phase image.

Next, in step S3, the frequency shift calculation unit 44 determines the amount of frequency shift per unit amount of gradient magnetic field based on the image value of the first phase image and on magnetic field strength and magnetic-field application duration of the bipolar gradient pulse.

Through the above procedures, the amount of frequency shift per unit amount of gradient magnetic field can be determined using only the first sequence.

With the first frequency shift measuring method, although it is difficult to reduce impacts of eddy current and environmental noise, it is possible to determine the amount of frequency shift per unit amount of gradient magnetic field.

A second frequency shift measuring method determines the amount of frequency shift using the first sequence and second sequence.

Figure 6:
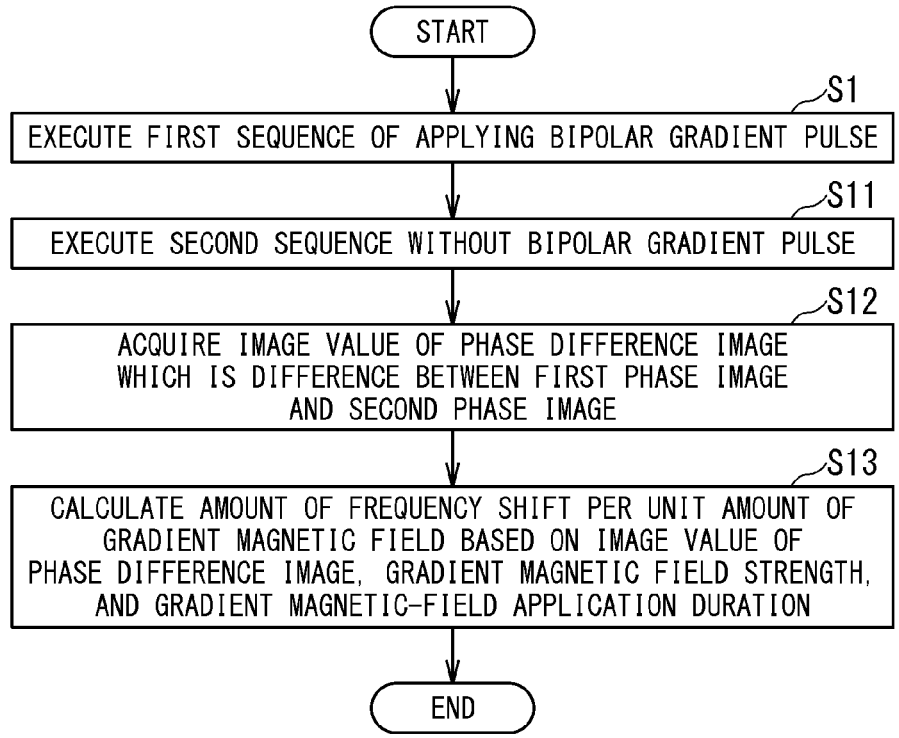
FIG. 6 is a flowchart showing an example of procedures carried out by the CPU of the main control unit shown in FIG. 1 to measure the amount of frequency shift using the second frequency shift measuring method.

FIG. 6 is a flowchart showing an example of procedures carried out by the CPU of the main control unit 34 shown in FIG. 1 to measure the amount of frequency shift using the second frequency shift measuring method. In FIG. 6, numbers prefixed by S represent steps of the flowchart. The procedures are started when sequence information about the first sequence and second sequence is read out of the storage unit 33 by the sequence reading unit 41. Steps equivalent to those in FIG. 5 are denoted by the same step numbers as the corresponding steps in FIG. 5, and redundant description thereof will be omitted.

In step S11, the phase image generating unit 42 executes the loaded second sequence and generates a phase image (hereinafter referred to as a second phase image) based on data obtained in the second sequence.

Next, in step S12, the image value acquisition unit 43 acquires an image value of a phase difference image which is a difference between the first phase image and second phase image.

Next, in step S13, the frequency shift calculation unit 44 determines the amount of frequency shift per unit amount of gradient magnetic field based on the image value of the phase difference image between the first phase image and second phase image and on the magnetic field strength and magnetic-field application duration of the bipolar gradient pulse.

Through the above procedures, the amount of frequency shift per unit amount of gradient magnetic field can be determined using the first sequence and second sequence.

The second frequency shift measuring method uses the image value of the phase difference image between the first phase image and second phase image. As shown in FIG. 4, by taking the difference between the first phase image and the second phase image, it is possible to reduce the impact of environmental noise.

Thus, the second frequency shift measuring method, which can use an image value with the impact of environmental noise reduced, can determine the amount of frequency shift per unit amount of gradient magnetic field more accurately than the first frequency shift measuring method.

A third frequency shift measuring method determines the amount of frequency shift using the first sequence and third sequence.

Figure 7:
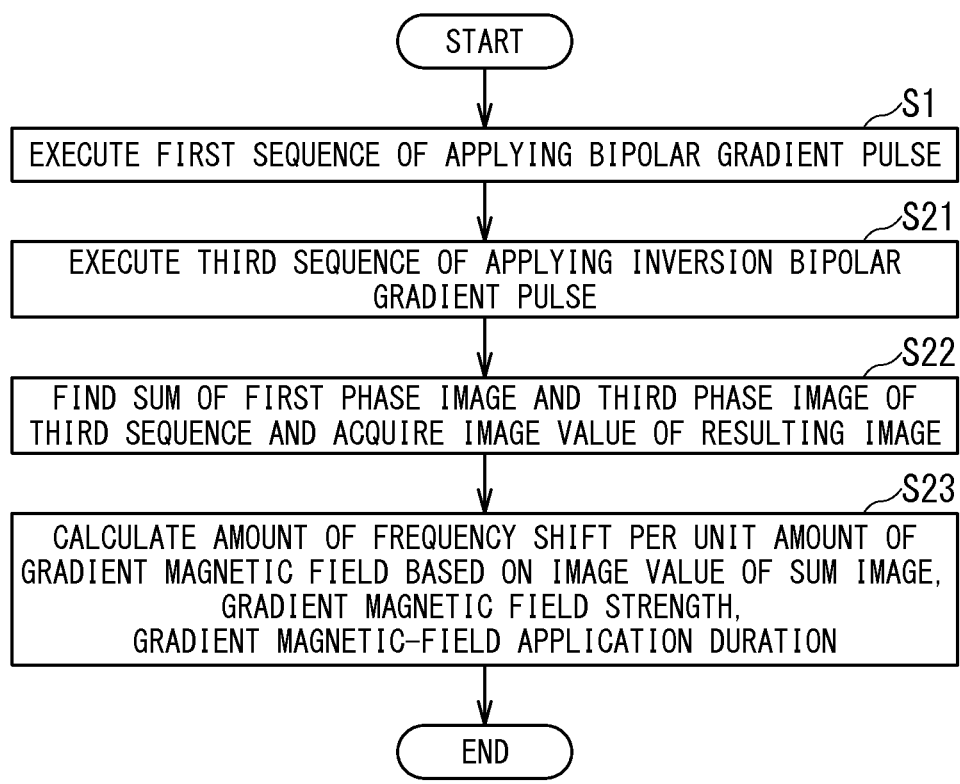
FIG. 7 is a flowchart showing an example of procedures carried out by the CPU of the main control unit shown in FIG. 1 to measure the amount of frequency shift using the third frequency shift measuring method.

FIG. 7 is a flowchart showing an example of procedures carried out by the CPU of the main control unit 34 shown in FIG. 1 to measure the amount of frequency shift using the third frequency shift measuring method. In FIG. 7, numbers prefixed by S represent steps of the flowchart. The procedures are started when sequence information about the first sequence and third sequence is read out of the storage unit 33 by the sequence reading unit 41. Steps equivalent to those in FIG. 5 are denoted by the same step numbers as the corresponding steps in FIG. 5, and redundant description thereof will be omitted.

In step S21, the phase image generating unit 42 executes the loaded third sequence and generates a phase image (hereinafter referred to as a third phase image) based on data obtained in the third sequence.

Next, in step S22, the image value acquisition unit 43 sums the first phase image and third phase image and acquires an image value of a resulting sum image.

Note that, the image value acquisition unit 43 may give a value obtained by dividing an image value of the sum image by 2 to the frequency shift amount calculation unit 44 to match scale with the first and second frequency shift measuring method.

Next, in step S23, the frequency shift calculation unit 44 determines the amount of frequency shift per unit amount of gradient magnetic field based on the image value of the sum image of the first phase image and third phase image and on the magnetic field strength and magnetic-field application duration of the bipolar gradient pulse.

Through the above procedures, the amount of frequency shift per unit amount of gradient magnetic field can be determined using the first sequence and third sequence.

The third frequency shift measuring method uses the image value of the sum image of the first phase image and third phase image. As shown in FIG. 4, by summing the first phase image and third phase image, it is possible to reduce the impact of eddy current.

Thus, the third frequency shift measuring method, which can use an image value with the impact of eddy current reduced, can determine the amount of frequency shift per unit amount of gradient magnetic field more accurately than the first frequency shift measuring method.

A fourth frequency shift measuring method determines the amount of frequency shift using the first sequence, second sequence, and third sequence.

Figure 8:
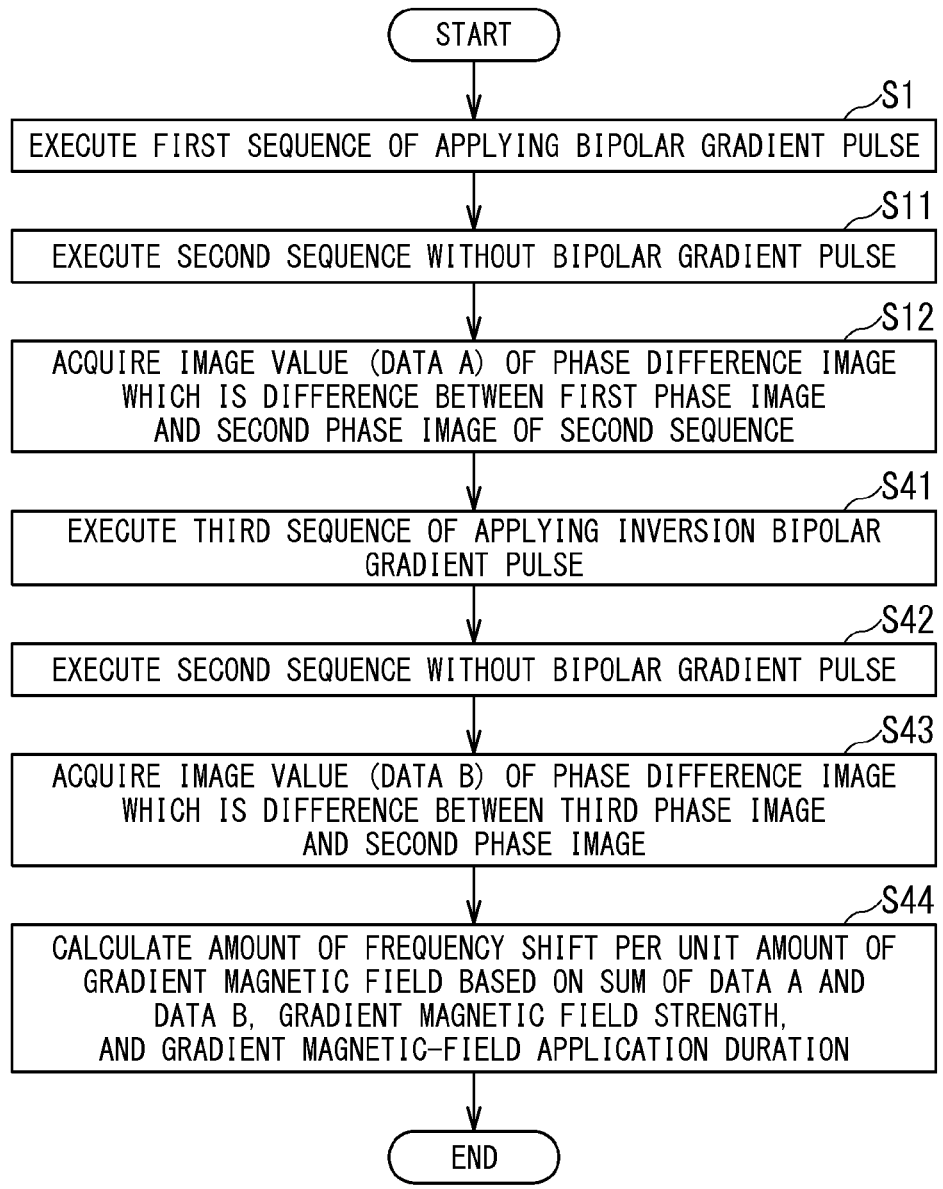
FIG. 8 is a flowchart showing an example of procedures carried out by the CPU of the main control unit shown in FIG. 1 to measure the amount of frequency shift using the fourth frequency shift measuring method.

FIG. 8 is a flowchart showing an example of procedures carried out by the CPU of the main control unit 34 shown in FIG. 1 to measure the amount of frequency shift using the fourth frequency shift measuring method. In FIG. 8, numbers prefixed by S represent steps of the flowchart. The procedures are started when sequence information about the first sequence, second sequence, and third sequence is read out of the storage unit 33 by the sequence reading unit 41. Steps equivalent to those in FIG. 6 are denoted by the same step numbers as the corresponding steps in FIG. 6, and redundant description thereof will be omitted.

When the image value (data A) of the phase difference image which is the difference between the first phase image and second phase image is acquired by the image value acquisition unit 43 in step S12, the phase image generating unit 42 executes the loaded third sequence in step S41 and generates the third phase image.

Next, in step S42, the phase image generating unit 42 executes the loaded second sequence and generates the second phase image.

Next, in step S43, the image value acquisition unit 43 acquires an image value (data B) of a phase difference image which is a difference between the third phase image and second phase image.

Next, in step S44, the frequency shift calculation unit 44 determines the amount of frequency shift per unit amount of gradient magnetic field based on a sum of the image value (data A) of the phase difference image between the first phase image and second phase image and the image value (data B) of the phase difference image which is the difference between the third phase image and second phase image and on the magnetic field strength and magnetic-field application duration of the bipolar gradient pulse.

The fourth frequency shift measuring method uses the sum of the image value (data A) of the phase difference image between the first phase image and second phase image and the image value (data B) of the phase difference image which is the difference between the third phase image and second phase image. The sum reflects reductions in the impact of environmental noise as well as in the impact of eddy current.

Thus, the fourth frequency shift measuring method, which can use an image value with the impacts of eddy current and environmental noise reduced, can determine the amount of frequency shift per unit amount of gradient magnetic field more accurately than the first, second, and third frequency shift measuring methods.

As described above, the MRI apparatus 10 according to the present embodiment can quantitatively measure the amount of frequency shift.

Incidentally, in any of the frequency shift measuring methods, the sequences may be executed with respect to any subject as long as phase images can be acquired, and a predetermined phantom may be used instead of the object P.

Next, description will be given of a method (hereinafter referred to as a frequency shift correction method) for reducing an impact of frequency shift on an MR image obtained by a scan sequence to be executed to obtain MR images of the object P.

Possible frequency shift correction methods include, for example, the following three methods.

A first frequency shift correction method corrects the phase of an RF transmit pulse.

Figure 9:
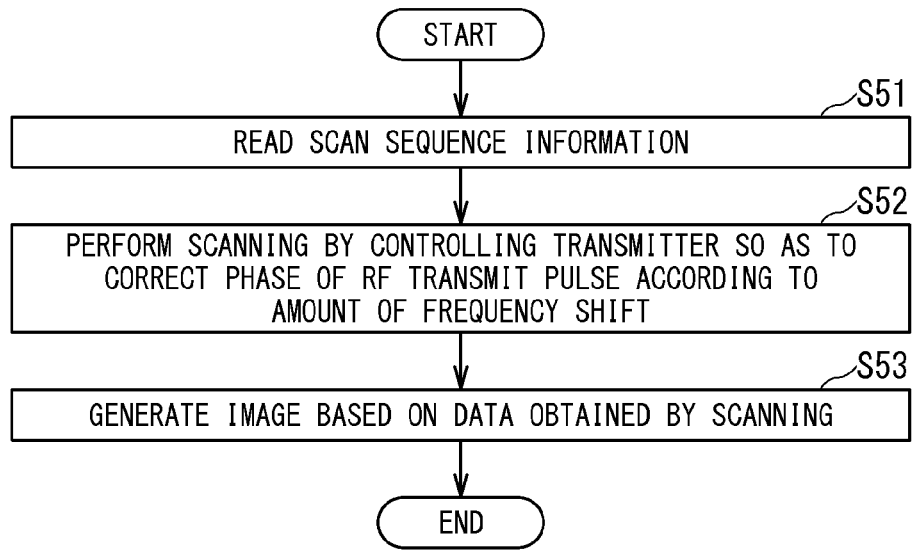
FIG. 9 is a flowchart showing an example of procedures carried out by the CPU of the main control unit shown in FIG. 1 to reduce the impact of frequency shift on an MR image using the first frequency shift correction method.

FIG. 9 is a flowchart showing an example of procedures carried out by the CPU of the main control unit 34 shown in FIG. 1 to reduce the impact of frequency shift on an MR image using the first frequency shift correction method. In FIG. 9, numbers prefixed by S represent steps of the flowchart. The procedures are started when the amount of frequency shift per unit amount of gradient magnetic field determined by the frequency shift calculation unit 44 is given to the scan image generating unit 45.

First, in step S51, the sequence reading unit 41 reads sequence information about a predetermined scan sequence to be executed to obtain an MR image of the object P, out of the storage unit 33.

Next, in step S52, in order to correct the phase of the RF transmit pulse applied in the predetermined scan sequence so as to reduce the impact of frequency shift on the MR image, the scan image generating unit 45 controls the transmitter 24 via the sequence controller 26 based on information about the amount of frequency shift per unit amount of gradient magnetic field determined by the frequency shift calculation unit 44 and information about the amount of gradient magnetic field applied in the predetermined scan sequence.

For example, with the FSE method, when a frequency shift occurs, an SE (Spin Echo) component and STE (Stimulated Echo) component fall out of synchronization in phase, resulting in sensitivity irregularities. Thus, if the predetermined scan sequence is based on the FSE method, the scan image generating unit 45 controls the transmitter 24 via the sequence controller 26 in order to correct the phase of the RF transmit pulse such that the SE component and STE component will coincide each other in phase.

An amount of correction to the phase of the RF transmit pulse may be modified based on information such as TE (Echo Time), echo space, and pulse length of the RF pulse contained in the predetermined scan sequence.

Next, in step S53, the scan image generating unit 45 generates an MR image based on the data obtained by executing the predetermined scan sequence and displays the image on the display unit 32.

Through the above procedures, the impact of frequency shift on the MR image can be reduced.

The first frequency shift correction method can remedy sensitivity irregularities caused by a shift in RF transmission phase and reduce the impact of frequency shift on the MR image by correcting the phase of the RF transmit pulse based on the information about the amount of frequency shift per unit amount of gradient magnetic field determined by the frequency shift calculation unit 44 and information about the amount of gradient magnetic field applied in the predetermined scan sequence.

The second frequency shift correction method corrects the phase of a receive signal.

The phase of the receive signal is subjected to cumulative modulation due to the frequency shift caused by a readout gradient magnetic field, and consequently an image shift occurs in a readout direction. Thus, displacement is remedied by correcting the phase of the receive signal so as to correct the impact of the frequency shift caused by a gradient magnetic field applied during readout.

Figure 10:
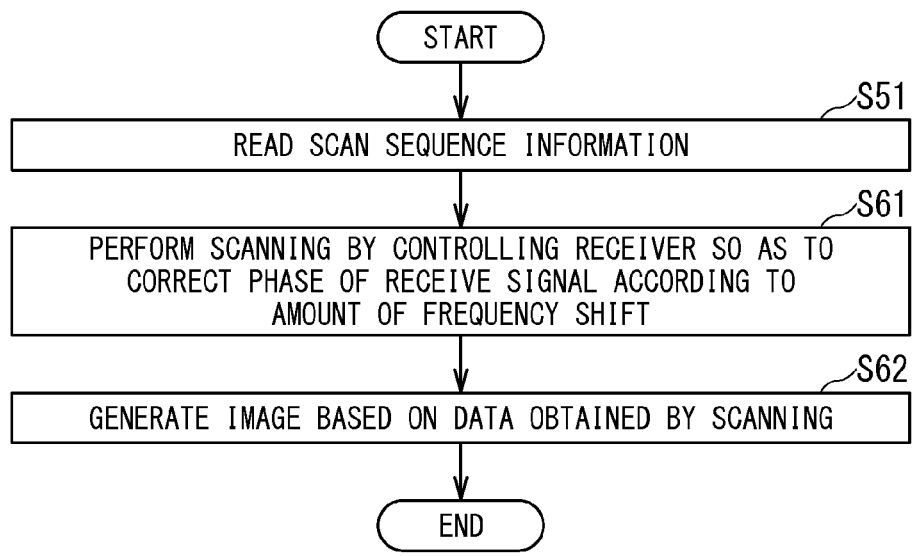
FIG. 10 is a flowchart showing an example of procedures carried out by the CPU of the main control unit shown in FIG. 1 to reduce the impact of frequency shift on an MR image using the second frequency shift correction method.

FIG. 10 is a flowchart showing an example of procedures carried out by the CPU of the main control unit 34 shown in FIG. 1 to reduce the impact of frequency shift on an MR image using the second frequency shift correction method. In FIG. 10, numbers prefixed by S represent steps of the flowchart. The procedures are started when the amount of frequency shift per unit amount of gradient magnetic field determined by the frequency shift calculation unit 44 is given to the scan image generating unit 45. Steps equivalent to those in FIG. 9 are denoted by the same step numbers as the corresponding steps in FIG. 9, and redundant description thereof will be omitted.

In step S61, in order to correct a phase of an MR signal received in the predetermined scan sequence so as to reduce the impact of frequency shift on the MR image, the scan image generating unit 45 controls the receiver 25 via the sequence controller 26 based on information about the amount of frequency shift per unit amount of gradient magnetic field determined by the frequency shift calculation unit 44 and information about the amount of gradient magnetic field applied in the predetermined scan sequence.

Next, in step S62, the scan image generating unit 45 generates an MR image based on the data obtained by executing the predetermined scan sequence and displays the image on the display unit 32.

Through the above procedures, the impact of frequency shift on the MR image can be reduced.

By correcting the phase of the receive signal based on the information about the amount of frequency shift per unit amount of gradient magnetic field determined by the frequency shift calculation unit 44 and information about the amount of gradient magnetic field applied in the predetermined scan sequence, the second frequency shift correction method can remedy the displacement caused by phase shift of the receive signal and reduce the impact of frequency shift on the MR image.

The third frequency shift correction method corrects an image value obtained by a scan sequence which is based on the phase contrast method (PC method).

If a frequency shift occurs when a scan sequence is executed based on the phase contrast method, since the phase is modulated, a result which indicates as if there were a flow is obtained even at a location where there is no flow.

Thus, it is advisable to obtain an appropriate flow velocity value by performing postprocessing for adding an offset to a reconstructed image based on the amount of frequency shift determined by the frequency shift calculation unit 44. Even if the phase of the RF transmit pulse or the phase of the receive signal is not corrected, the impact of frequency shift on the MR image can also be reduced by correcting the image value via image processing based on the information about the amount of frequency shift per unit amount of gradient magnetic field.

Figure 11:
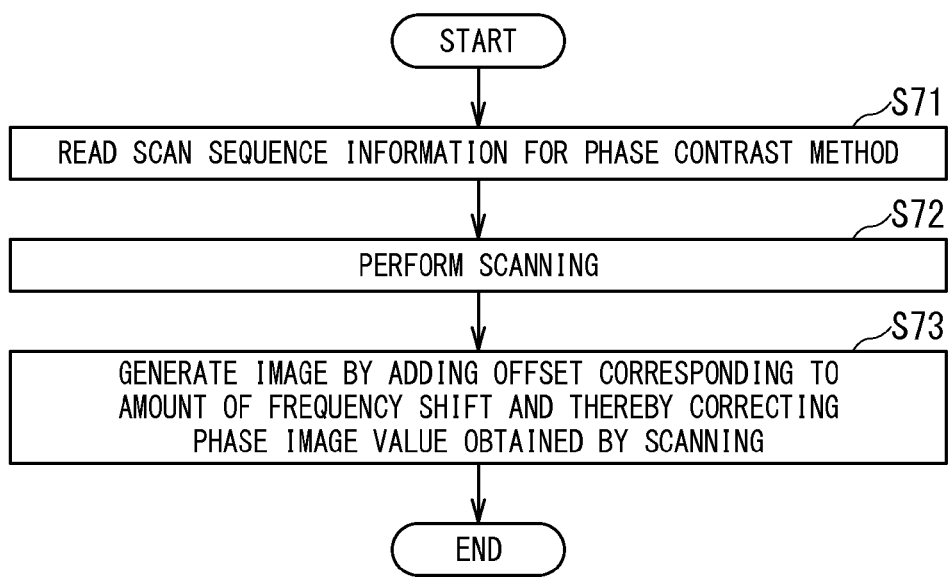
FIG. 11 is a flowchart showing an example of procedures carried out by the CPU of the main control unit shown in FIG. 1 to reduce the impact of frequency shift on a phase image using the third frequency shift correction method.

FIG. 11 is a flowchart showing an example of procedures carried out by the CPU of the main control unit 34 shown in FIG. 1 to reduce the impact of frequency shift on a phase image using the third frequency shift correction method. In FIG. 11, numbers prefixed by S represent steps of the flowchart. The procedures are started when the amount of frequency shift per unit amount of gradient magnetic field determined by the frequency shift calculation unit 44 is given to the scan image generating unit 45.

First, in step S71, the sequence reading unit 41 reads sequence information about a scan sequence based on the phase contrast method out of the storage unit 33.

Next, in step S72, the scan image generating unit 45 performs a scan by controlling the sequence controller 26 based on the sequence information.

Next, in step S73, the scan image generating unit 45 generates a corrected MR image by adding an offset to a phase image value obtained by executing a scan sequence by the phase contrast method and displays the image on the display unit 32, where the offset is added based on the information about the amount of frequency shift per unit amount of gradient magnetic field determined by the frequency shift calculation unit 44 and information about the amount of gradient magnetic field applied in the predetermined scan sequence.

Through the above procedures, the impact of frequency shift on the MR image can be reduced.

The third frequency shift correction method can reduce the impact of frequency shift on the MR image by correcting the image value of the phase image using postprocessing based on the information about the amount of frequency shift per unit amount of gradient magnetic field determined by the frequency shift calculation unit 44 and information about the amount of gradient magnetic field applied in the scan sequence executed by the phase contrast method. The method also makes it possible to calculate a more reliable blood flow velocity value from the image value of the phase image.

Note that frequency shifts due to fluctuations in static magnetic field strength occur as a result of various factors such as execution of a pulse sequence or variation with time. There are individual differences among MRI apparatus in an amount of this type of fluctuation in static magnetic field strength. Also, the static magnetic field strength may fluctuate greatly in a short period such as in a day, for example, by fluctuating on each execution of the pulse sequence or may not fluctuate much over a predetermined period such as over a few days or more.

Thus, the amount of frequency shift can be determined not only just before executing the scan sequence to acquire an MR image. Of course, when the amount of frequency shift used in the frequency shift correction method is determined just before each scan sequence executed to acquiring an MR image, the amount of frequency shift can be corrected appropriately even if the amount of frequency shift fluctuates greatly in a short period.

Also, when the amount of frequency shift does not fluctuate much over a predetermined period, the frequency shift calculation unit 44 may store the amount of frequency shift determined in advance on the storage unit 33, a storage medium of the main control unit 34, or a storage medium on a network and correct the amount of frequency shift using the amount of frequency shift stored on the storage medium. This makes it possible to reduce frequency with which a process of determining the amount of frequency shift is performed.

The MRI apparatus 10 according to the present embodiment can quantitatively measure the amount of frequency shift. Also, the amount of frequency shift generally takes a value unique to each apparatus. Therefore, by quantitatively determining the amount of frequency shift in advance, it is possible to easily and accurately reduce the impact of frequency shift on scan images (MR images) and improve image quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a phase image generating unit configured to execute a sequence including an application of a bipolar gradient pulse and thereby generate a first phase image;
an image value acquisition unit configured to acquire an image value of the first phase image; and
a frequency shift calculation unit configured to determine an amount of frequency shift per unit amount of gradient magnetic field based on the magnetic field strength of the bipolar gradient pulse and on the image value of the first phase image.

2. The magnetic resonance imaging apparatus according to claim 1, wherein:
the phase image generating unit further generates a second phase image by executing a sequence without a gradient pulse;
the image value acquisition unit acquires an image value of a differential image between the first phase image and the second phase image; and
the frequency shift calculation unit determines an amount of frequency shift per unit amount of gradient magnetic field based on the magnetic field strength of the bipolar gradient pulse and on the image value of the differential image between the first phase image and the second phase image.

3. The magnetic resonance imaging apparatus according to claim 1, wherein:
the phase image generating unit further generates a third phase image by executing a sequence including an application of an inversion bipolar gradient pulse obtained by inverting a polarity of the bipolar gradient pulse;
the image value acquisition unit acquires an image value of a sum image of the first phase image and third phase image; and
the frequency shift calculation unit determines an amount of frequency shift per unit amount of gradient magnetic field based on the magnetic field strength of the bipolar gradient pulse and on the image value of the sum image of the first phase image and third phase image.

4. The magnetic resonance imaging apparatus according to claim 1, wherein:
the phase image generating unit further generates a second phase image by executing a sequence without a gradient pulse and further generates a third phase image by executing a sequence including an application of an inversion bipolar gradient pulse obtained by inverting a polarity of the bipolar gradient pulse;
the image value acquisition unit acquires an image value of a differential image between the first phase image and the second phase image, and acquires an image value of a differential image between the third phase image and the second phase image; and
the frequency shift calculation unit determines an amount of frequency shift per unit amount of gradient magnetic field based on the magnetic field strength of the bipolar gradient pulse, and on a sum of the image value of the differential image between the first phase image and the second phase image and the image value of the differential image between the third phase image and the second phase image.

5. The magnetic resonance imaging apparatus according to claim 1, further comprising:
a scan image generating unit configured to control a transmission unit transmitting a radio-frequency transmit pulse so as to correct, when executing a scan sequence to obtain an MR image of an object, a phase of the radio-frequency transmit pulse applied in the scan sequence based on the amount of frequency shift per unit amount of gradient magnetic field determined by the frequency shift calculation unit.

6. The magnetic resonance imaging apparatus according to claim 1, further comprising:
a scan image generating unit configured to control a receiver unit receiving an MR signal so as to correct, when executing a scan sequence to obtain an MR image of an object, a phase of the MR signal received in the scan sequence based on the amount of frequency shift per unit amount of gradient magnetic field determined by the frequency shift calculation unit.

7. The magnetic resonance imaging apparatus according to claim 1, further comprising:
a scan image generating unit configured to add an offset to a phase image value obtained through an execution of a scan sequence based on a phase contrast method and thereby correct the phase image value when executing the scan sequence, the offset being based on the amount of frequency shift per unit amount of gradient magnetic field determined by the frequency shift calculation unit.

8. The magnetic resonance imaging apparatus according to claim 1, wherein the frequency shift calculation unit stores the amount of frequency shift per unit amount of gradient magnetic field in a storage unit.

9. The frequency shift measuring method comprising:
executing a sequence including an application of a bipolar gradient pulse and thereby generating a first phase image;
acquiring an image value of the first phase image; and
determining an amount of frequency shift per unit amount of gradient magnetic field based on the magnetic field strength of the bipolar gradient pulse and on the image value of the first phase image.

* * * * *